(12) United States Patent
Zeng et al.

(10) Patent No.: US 10,177,873 B1
(45) Date of Patent: Jan. 8, 2019

(54) CONCURRENT SUPPORT FOR MULTIPLE FREQUENCY BANDS FOR SATELLITE NAVIGATION SIGNALS

(71) Applicant: QUALCOMM Incorporated, San Diego, CA (US)

(72) Inventors: Yi Zeng, San Jose, CA (US); Hong Sun Kim, San Jose, CA (US); Cheng-Han Wang, San Jose, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 15/971,609

(22) Filed: May 4, 2018

(51) Int. Cl.
G01S 19/32 (2010.01)
H04K 3/00 (2006.01)
H03F 3/19 (2006.01)
H04B 1/30 (2006.01)
H03H 11/34 (2006.01)
H03D 7/16 (2006.01)

(52) U.S. Cl.
CPC ............... *H04K 3/90* (2013.01); *H03D 7/165* (2013.01); *H03F 3/19* (2013.01); *H03H 11/344* (2013.01); *H03H 11/346* (2013.01); *H04B 1/30* (2013.01); *H04K 3/228* (2013.01); *H03F 2200/294* (2013.01); *H03F 2200/451* (2013.01); *H04K 2203/32* (2013.01)

(58) Field of Classification Search
CPC .......... G01S 19/32; G01S 19/33; G01S 19/21; H04B 1/005; H04B 1/0053; H04B 1/0057
USPC .............................. 375/148, 316; 342/357.72
See application file for complete search history.

(56) References Cited

U.S. PATENT DOCUMENTS

| | | | | |
|---|---|---|---|---|
| 7,639,724 B2* | 12/2009 | Tso | .......................... | G01S 19/36 342/103 |
| 8,494,456 B2* | 7/2013 | Tanaka | ..................... | H04B 1/28 375/295 |
| 8,649,463 B2* | 2/2014 | Nakano | ................ | H04J 11/0066 375/130 |
| 2006/0176215 A1* | 8/2006 | Dubash | ................... | G01S 19/32 342/357.64 |
| 2006/0227905 A1* | 10/2006 | Kunysz | ................... | G01S 19/32 375/345 |

* cited by examiner

*Primary Examiner* — Kevin Kim
(74) *Attorney, Agent, or Firm* — M. Munes Tomeh (57) ABSTRACT

A radio frequency (RF) receiver, for example a satellite positioning system receiver, can be configured to use a single phase locked loop for generating an oscillator signal to perform downconversion of signals in two different frequency bands using two or more local oscillators. A first RF signal portion includes a first signal band and undergoes double downconversion using a first mixer and a second mixer, while a second RF signal portion includes a second signal band and undergoes single downconversion using a single mixer. A controller is configured to determine a first oscillator divider value and a second oscillator divider value to avoid a jammer frequency and frequency dividers are used to generate the two or more local oscillators.

22 Claims, 6 Drawing Sheets

CONCURRENT SUPPORT FOR MULTIPLE FREQUENCY BANDS FOR SATELLITE NAVIGATION SIGNALS

BACKGROUND

There has been a trend towards concurrent support for multiple frequency bands for satellite navigation signals for various satellite navigation systems, such as, for example, various Global Navigation Satellite Systems (GNSSs). To reduce cost and size of satellite navigation receivers, it is possible to use common components for the different signal paths for each of the multiple frequency bands. For example, different signal paths may share a common oscillator and/or other components. However, use of common components also raise issues with signal interference that ought to be mitigated.

SUMMARY

In one aspect, a method for processing a radio frequency (RF) signal received at one or more antennae includes receiving a first RF signal portion of the RF signal on a first signal path, identifying a jammer frequency, selecting a first oscillator divider value and a second oscillator divider value based on the identified jammer frequency, dividing the frequency of an oscillator signal using the first oscillator divider value to generate a first local oscillator signal, dividing the frequency of the oscillator signal using the second oscillator divider value to generate a second local oscillator signal, performing a first downconversion of the first RF signal portion on the first signal path by mixing the first RF signal portion with the first local oscillator signal to generate a first downconversion output signal on the first signal path, performing a second downconversion of the first downconversion output signal on the first signal path by mixing the first downconversion output signal with the second local oscillator signal to generate a second downconversion output signal on the first signal path, and filtering the second downconversion output signal to isolate an in-band signal from the jammer frequency. In some examples, the method can further comprise receiving a second RF signal portion of the RF signal on a second signal path and performing a single downconversion of the second RF signal portion on the second signal path by mixing the first RF signal portion with a single local oscillator signal.

In another aspect, a radio frequency (RF) receiver can comprise a first signal path to receive a first RF signal portion, a controller configured to determine a first oscillator divider value and a second oscillator divider value based on a jammer frequency, a first frequency divider configured to output a first local oscillator signal by dividing a frequency of an oscillator signal by the first oscillator divider value, a second frequency divider configured to output a second local oscillator signal by dividing the frequency of the oscillator signal by the second oscillator divider value, a first mixer configured to downconvert the first RF signal portion on the first signal path by mixing the first RF signal portion with the first local oscillator signal to generate a first downconversion output signal on the first signal path, a second mixer configured to downconvert the first downconversion output signal on the first path by mixing the first downconversion output signal with the second local oscillator signal to generate a second downconversion output signal on the first signal path, and a filter configured to filter the second downconversion output signal on the first signal path to isolate an in-band signal from the jammer frequency. In one example, the RF receiver can further comprise a second signal path to receive a second RF signal portion and a diplexer configured to receive an input RF signal from a single antenna and to provide a first output and a second output, the first output comprising the first signal path for the first RF signal portion and the second output comprising the second signal path for the second RF signal portion. In one such example, the RF receiver can further comprise a single mixer configured to downconvert the second RF signal portion on the second signal path by mixing the first RF signal portion with a single local oscillator signal. In one example, the RF receiver can be disposed within a mobile device, for example, within a satellite positioning system of a mobile device.

In one aspect, an apparatus for processing a radio frequency (RF) signal received at one or more antennae can comprise a first signal path, means for identifying a jammer frequency, means for selecting a first oscillator divider value and a second oscillator divider value based on the identified jammer frequency, means for dividing the frequency of an oscillator signal using the first oscillator divider value to generate a first local oscillator signal, means for dividing the frequency of the oscillator signal using the second oscillator divider value to generate a second local oscillator signal, means for performing a first downconversion of the first RF signal portion on the first signal path by mixing the first RF signal portion with the first local oscillator signal to generate a first downconversion output signal on the first signal path, means for performing a second downconversion of the first downconversion output signal on the first signal path by mixing the first downconversion output signal with the second local oscillator signal to generate a second downconversion output signal on the first signal path, and means for filtering the second downconversion output signal to isolate an in-band signal from the jammer frequency. In some examples, the apparatus can further comprise a second signal path and means for performing a single downconversion of the second RF signal portion on the second signal path by mixing the first RF signal portion with a single local oscillator signal.

DETAILED DESCRIPTION

Reference throughout this specification to "one example", "one feature", "an example" or "one feature" means that a particular feature, structure, or characteristic described in connection with the feature and/or example may be included in at least one feature and/or example of claimed subject matter. Thus, the appearances of the phrase "in one example", "in one embodiment" "an example", "in one feature" or "a feature" in various places throughout this specification are not necessarily all referring to the same feature and/or example. Furthermore, the particular features, structures, or characteristics may be combined in one or more examples and/or features. Although various examples are described below with respect to Global Positioning System (GPS) signals and particular frequency bands, they are not provided in a limiting fashion, and the claims are applicable to all types of signals and receivers unless explicitly limited to particular types of receivers and signals within the claim.

Figure 4:
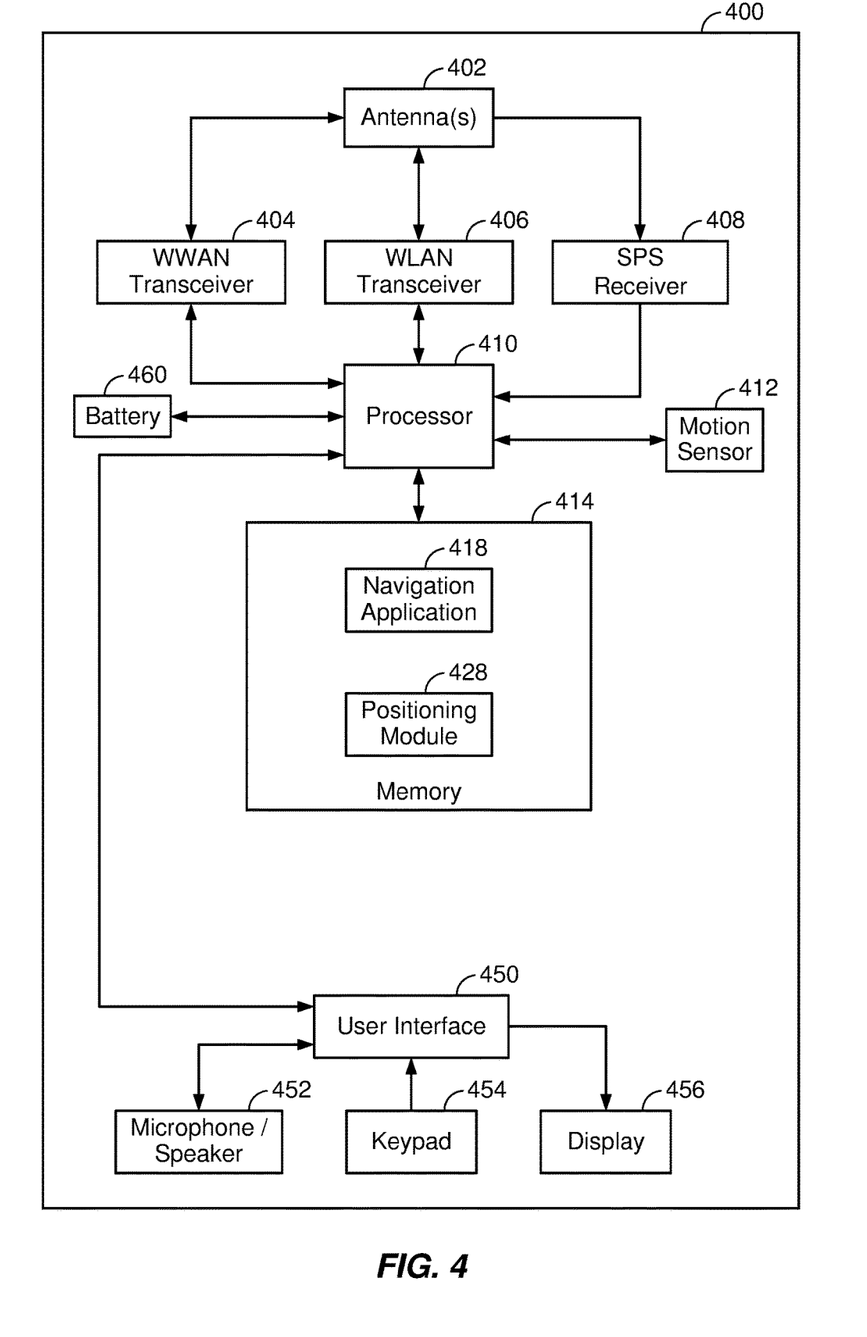
FIG. 4 illustrates an exemplary mobile device that may be used to determine position and to provide navigation to a user using navigation signals from one or more satellites.

In the context of the embodiments described herein, the terms "receiver" and "Global Navigation Satellite Systems (GNSS) receiver" can designate a complete self-contained receiver device, but also a module, included in a complex device, for example a GNSS (e.g., GPS, GLONASS, etc.) module in a mobile device such as a mobile device 400 with reference to FIG. 4. Such a receiver may also be termed a satellite positioning system (SPS) receiver. The terms "receiver" and "GNSS receiver" should also be understood, in the context of the embodiments described herein, as including one of more integrated circuits, arranged to realize a GNSS receiver (e.g. a Galileo, GPS, GLONASS, BeiDou system, or a local or regional navigation system, or other type of GNSS receiver or a complete module), as defined above.

It is desirable to receive GNSS signals in multiple frequency bands to make the GNSS receiver more versatile and more stable in noisy or occluded environments. For example, conventional GPS receivers have included the capability to receive both L1 and L5 (or other satellite signal band, for example, an L2 band) signals so that L5 signals can be used when L1 signals are unavailable. Such receivers have used separate analog processing circuits or have used spatial and time multiplexing to receive both the L1 and L5 signals. The use of separate circuits to receive L1 and L5 signals adds to the size, cost and weight of the receiver. The use of separate circuits also can entail separate analog signal paths which adds to the pin count for components within the receiver. The use of spatial and time multiplexing can degrade the resolution associated with the reception of the signal.

GNSS receivers have been integrated in various products, such as, mobile phones, smart phones, tablets, netbooks, laptops, automobile, etc. In one particular example, GNSS receivers are gaining more importance in the automotive space, as increasing levels of autonomy for vehicle navigation and control demand greater accuracy of positioning. In these various use cases, it would be desirable to include multiple types of GNSS receivers in the products to provide navigation operations with greater versatility and stability. For example, one type of GNSS system may not be available in a particular area or a signal for a certain GNSS may be jammed, and it may be desirable to use another type of GNSS or another GNSS signal. Additionally, or alternatively, concurrent use of multiple bands, for example concurrent use of L1 and L5 band, can increase position accuracy. However, the integration of more types of GNSS receivers into products adds to the size, cost and weight of the products. For example, having a separate analog signal processor for each type of GNSS adds to the size, cost and weight of the product. Further having separate analog signal paths for each GNSS and each GNSS signal adds to the pin count within the product and adds multiple analog-to-digital converters (ADCs) to the interface product.

Figure 1:
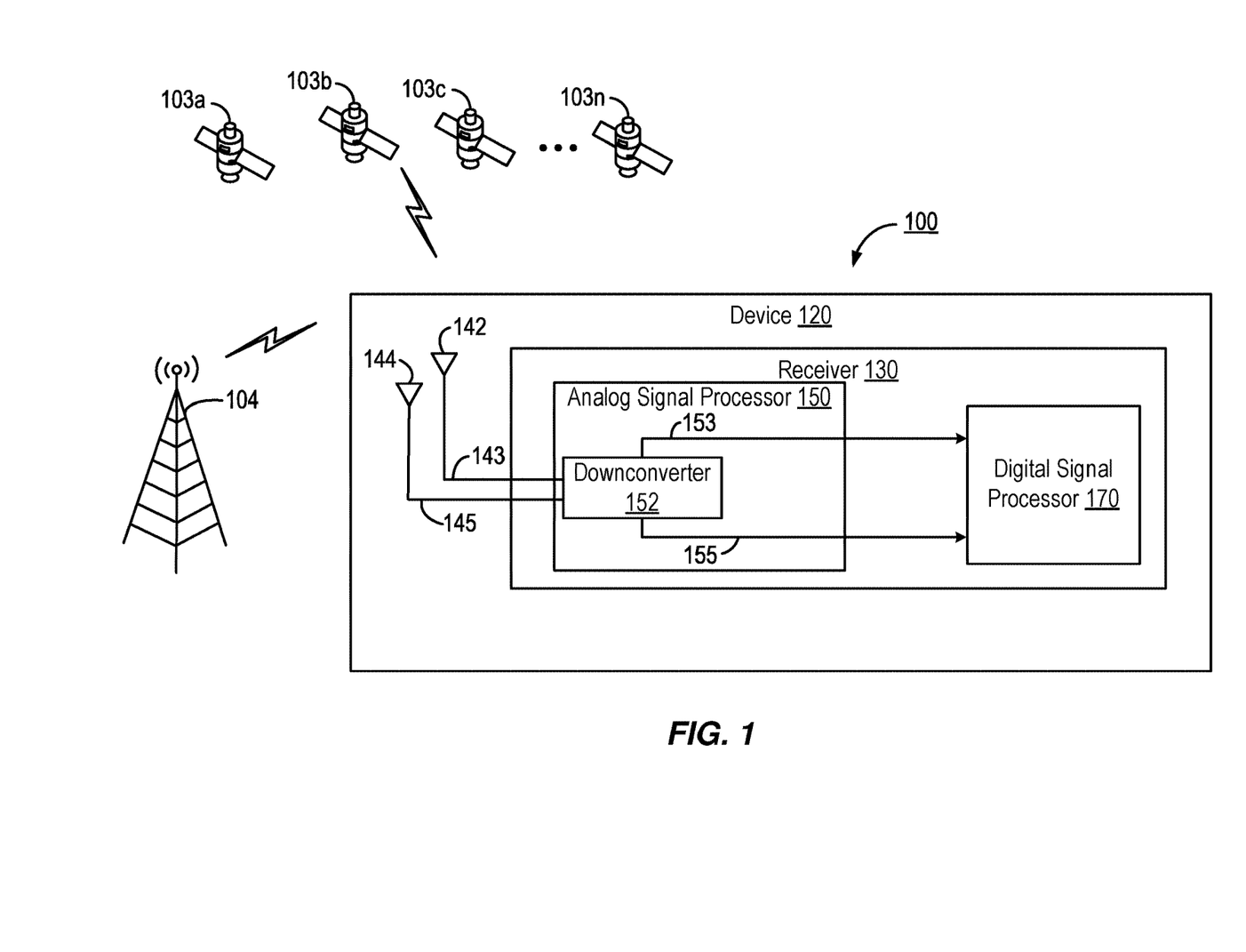
FIG. 1 illustrates an example of a device in a wireless signal environment including satellites and base stations.

FIG. 1 illustrates an example of a device in a wireless signal environment including satellites and base stations. Communication system 100 includes a device 120 that is configured to receive radio frequency (RF) signals from satellites 103a, 103b, 103c, . . . , 103n, a base station 104, a pseudolite, etc. Device 120 can be any type of signal processing device. According to one embodiment, device 120 is a GNSS capable device that can be integrated into a larger product or system, such as the products or systems described above with reference to a GNSS module included in a complex device. In some embodiments, the device 120 may be a portable device such as but not limited to a cellular phone, smart phone, tablet, laptop computer and may include various other components that are not described herein.

Device 120 includes an antenna 142, an antenna 144, and a receiver 130. Although shown as two separate antennas 142 and 144, antennas 142 and 144 can be combined as a single antenna with one or more elements. Receiver 130 includes an analog front end or analog signal processor 150, and a digital signal processor 170 in one embodiment. Analog signal processor 150 is coupled to a signal path 143 associated with antenna 142 and a signal path 145 associated with antenna 144. Analog signal processor 150 is coupled to the digital signal processor 170 via an analog signal paths 153 and 155.

In one embodiment, device 120 is advantageously configured to process more than one GNSS signal from a single GNSS system and/or signals from more than one type of GNSS. In one embodiment, device 120 can process L1 and L5 signals from the GPS using the same analog front end (e.g., analog signal processor 150). Although GPS is mentioned, device 120 can be configured to process signals from other sources, such as, other types of GNSS including but not limited to signals associated with the BeiDou satellite navigation system, the Galileo satellite navigation system, GLONASS satellite navigation system, NAVigation with Indian Constellation (NAVIC) satellite navigation system, and other regional or local navigation systems.

Analog signal processor 150 includes a downconverter 152, signal path 153, signal path 155. Analog signal processor 150 is configured to receive the signals (e.g., positional signals such as but not limited to, GNSS L1, L5 signals and/or other signals) from the antennas 142 and 144 and perform analog signal processing to create an analog output signals at analog signal paths 153 and 155 for digital signal processor 170. In some implementations, signal paths 143 and 153 together form a first signal path for a, for example, first signal received from antenna 142, while signal paths 145 and 155 together form a second signal path for a, for example, second signal received from antenna 144. The digital signal processor 170 coverts the analog output signal to a digital signal and processes the digital signal for navigation, targeting and/or positioning operations. Each of paths 153 and 155 can include multiple conductors, such as, a four conductor path for differential I and Q signals associated with a modulated satellite signal, in one embodiment. Alternatively, paths 153 and 155 can can each include a conductor pair or a single conductor. As illustrated, each of L1 and L5 has an output signal path into the digital signal processor 170 and each of these output signal paths may include a plurality of conductor paths, for example, each of two bands (L1 and L5) can include a four conductor path for differential I and Q signals resulting in a total of 8 conductive paths into the digital signal processor 170. Embodiments of device 120 can advantageously be configured to perform navigation, targeting and/or positioning operations in a stable manner, while optimizing receiver 130 for lower pin count, size, and power usage.

Frequency downconverter 152 may receive two or more signals and intersperse each signal in the frequency domain such that each signal does not overlap any other signal in one embodiment. In some example embodiments, frequency downconverter 152 is configured to place the baseband signal of a first signal at intermediate frequency (IF), for example, at zero intermediate frequency (ZIF) (e.g., 0 MHz), very low IF (VLIF)) (e.g., ±1 MHz), or low IF (LIF) (e.g., ±3 MHz). In this embodiment, the baseband signal of the first signal may be interspersed away from the second signal. The first signal is transmitted on path 153 to a digital signal processor 170 and the second signal is transmitted on path 155 to the digital signal processor 170. In an example embodiment, the digital signal processor 170 may be located on a different physical chip than the analog signal processor 150. Alternatively, the digital signal processor 170 is located on the same chip as the analog signal processor.

In order to design the downconverter 152 as economically as possible, it would be advantageous to use the same phase locked loop to supply the local oscillator signal for the mixers involved in the downconversion of the signals in the different frequency bands, for example, the L1 and L5 bands for satellite navigation to reduce the number of components in the receiver. The frequency of such a local oscillator could be divided to provide for an appropriate frequency for downconversion for both the L1 and L5 bands. However, for ease of hardware implementation, it would be advantageous to divide the main oscillator frequency by an even integer value, and in some implementations, by an even integer value that is a power of 2 (e.g., 2, 4, 8, 16, etc.). As such, it is not possible to provide a local oscillator having a first arbitrary frequency for downconverting the L1 band while simultaneously providing a local oscillator having a second arbitrary frequency for downconverting the L5 band without adding to the complexity and cost of the shared phase locked loop circuit and/or the dividers providing the local oscillator signals to be used when performing the downconversions on both the L1 and the L5 signals.

Hence, one design possibility is to set the main oscillator to a frequency that can be used directly or divided to optimally downconvert one of the two bands, for example the L1 band. Generally speaking, while such a frequency may downconvert the one band to be very close to DC, the other band, for example the L5 band, may still require further downconversion to bring the output of the first downconversion of the other band closer to DC. Since the one band was downconverted using an optimal local oscillator frequency, the optimal local oscillator frequency will generally be selected to reduce any problems with interference by any jammer frequencies. However, the other band, undergoing downconversion using unoptimizied local oscillator frequencies may face scenarios where the first or second downconversion may downconvert both the desired band signal and a jammer frequency to the same intermediate frequency range.

Figure 2A:
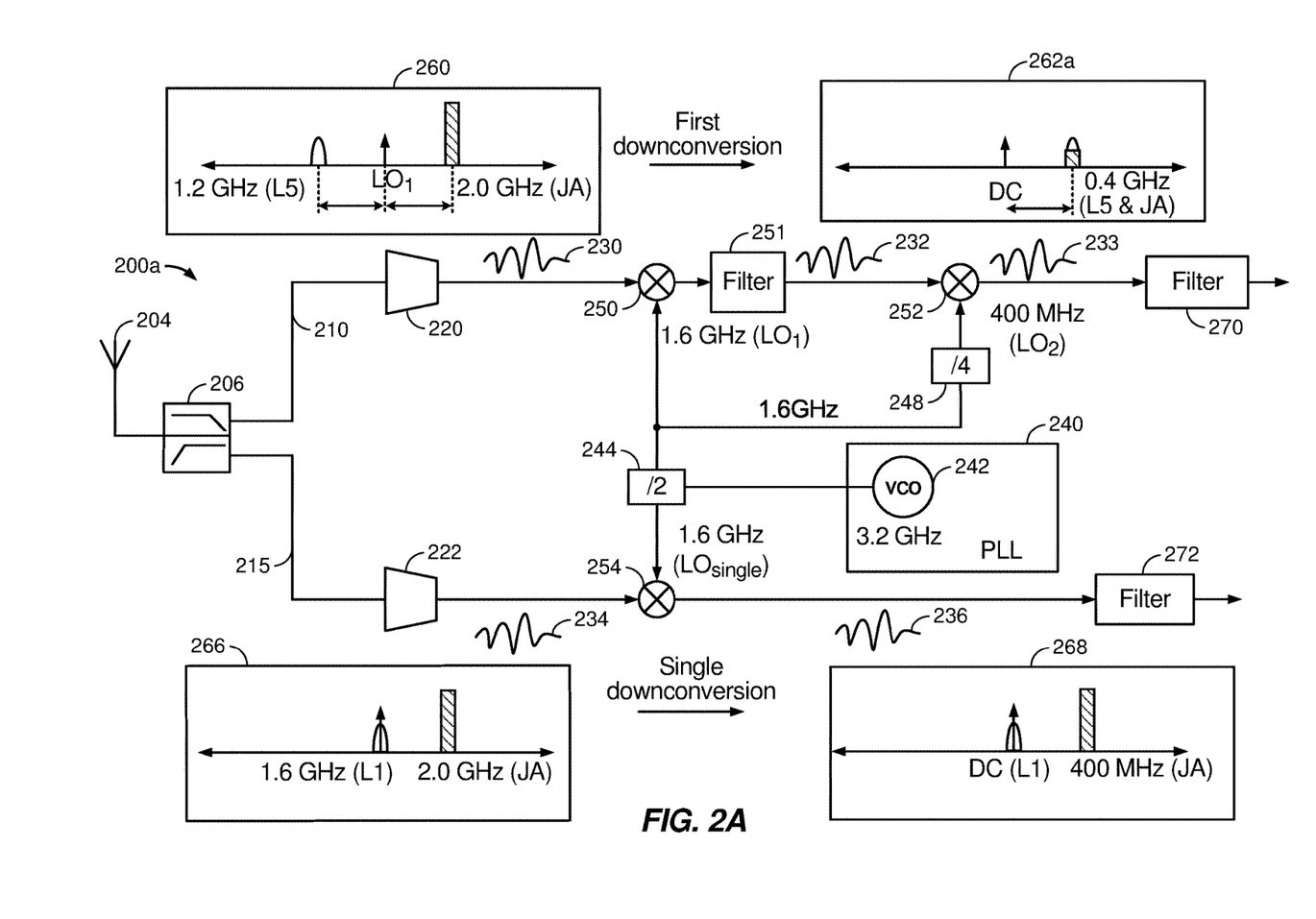
FIG. 2A illustrates one example of a jammer fail scenario where the intended signal undergoing double downconversion faces interference from a jammer.

FIG. 2A illustrates one example of a jammer fail scenario where the intended signal undergoing double downconversion faces interference from a jammer. As noted above, optimizing the local oscillator frequency for one band, while keeping phase locked loop circuitry as simple as possible, may result in local oscillator frequencies for downconversion the other band that are not optimal and that may result in jammer interference after downconversion.

Downconverter 200a of FIG. 2A includes one example implementation of downconverter 152 of FIG. 1 and includes an antenna 204 and a diplexer 206. In the single antenna implementation illustrated, the diplexer 206 can be configured to receive the RF signal received by the antenna 204 and to provide a first RF signal portion on a first signal path 210 and a second RF signal portion on a second signal path 215. As illustrated, the single input to the diplexer 206 is divided into two separate output paths towards amplifiers 220 and 222. In some implementations, the antenna 204 could be shared by multiple RF systems, including any combination of a global navigation satellite system (GNSS) receiver, a wireless wide area network (WWAN) transceiver, and/or a wireless local area network (WLAN). The antenna 204 can be configured to receive an RF signal, and it is understood that while only one antenna is shown, in some implementations, two separate antennae may be used for the two different signal paths shown in downconverter 200a. Although not illustrated, it is understood that a filter may be disposed between the antenna 204 and the amplifiers 220 and 222 (for example, before or after diplexer 206), such as, for example, an L1 and L5 band double surface acoustic wave (SAW) filter. In the illustrated example, the first RF signal portion is passed through a low pass filter included in the diplexer 206, and hence the first RF signal portion includes a lower frequency band, illustrated as an L5 band. Despite the low pass filter, a very strong jammer signal JA, such as an Long-Term Evolution (LTE) signal transmitted by a device in close proximity to the antenna 204, in some examples, the same device as the device including the antenna 204, may still be present in the first RF signal portion. In the illustrated example, the second RF signal portion is passed through a high pass filter included in the diplexer 206, and hence the second RF signal portion includes a higher frequency band, illustrated as an L1 band. The second RF signal portion also includes the jammer signal JA. Downconverter 200a also includes amplifier 220 along the first signal path 210 and amplifier 222 along the second signal path. Although illustrated as a single amplifier on each signal path, it is understood that one or both of amplifier 220 can include more than one amplifier depending on any given design specification with regards to gain, noise, and/or linearity. Where gain, noise, and/or linearity specifications can be better achieved with two amplifiers, either or both of amplifier 220 and/or 222 can include two amplifiers where, optionally, at least one of said two amplifiers includes a low noise amplifier (LNA). For example, where satellite signals are weak, on any given signal path (for example, first signal path 210 or second signal path 215), the first amplifier a received signal sees may be a LNA, whether wideband or narrowband, while subsequent amplifiers can include, for example, transconductance amplifiers. The first signal path 210 can be configured to receive the first RF signal portion 230 and the second signal path 215 can be configured to receive the second RF signal portion 234. After passing amplifier 220, the first RF signal portion 230 travelling along the first signal path 210 is then downconverted a first time by mixing the first RF signal portion 230 with a first local oscillator signal having a frequency $LO_1$ to generate a first downconversion output signal 232 on the first signal path 210. Similarly, after passing amplifier 222, the second RF signal portion 234 travelling along the second signal path 215 is then downconverted a single time by mixing the second RF signal portion 234 with a single local oscillator signal having a frequency of $LO_{single}$ to generate a single downconversion output signal 236 travelling on the second signal path 215. As is shown in downconverter 200a, phase locked loop (PLL) 240 includes a main oscillator 242, illustrated as a voltage controlled oscillator (VCO) providing a 3.2 GHz signal. The 3.2 GHz output of the PLL 240 is frequency divided by two (2) using frequency divider 244 to provide both the first local oscillator signal having frequency $LO_1$ and the single local oscillator signal having frequency $LO_{single}$.

Downconverter 200a illustrates a jammer fail scenario where the presence of jammer signal JA in the first RF signal portion 230 along the first signal path 210 causes interference with the desired signal band, illustrated as a 1.2 GHz L5 band, after a first downconversion by first mixer 250. Although a second downconversion to bring the first downconversion output signal on the first signal path 210 closer to DC would be desirable by performing a second downconversion using a second mixer 252, such a second downconversion would not be able to remove the interference from the jammer signal JA. In this example, the second RF signal portion 234 propagating along the second signal path 215 is downconverted by single mixer 254, however the jammer signal JA remains isolated in the single downconversion output signal 236.

Graph 260 illustrates the frequency bands of the signals in the first RF signal portion 230 before the first downconversion using first mixer 250 in the first signal path 210. As shown in graph 260, the first RF signal portion 230 includes a 1.2 GHz L5 band and also includes a 2.0 GHz jammer signal JA. For example, jammer signal JA power could be on order of 100 dB greater than the L5 band signal power. When downconverted using the first mixer 250 and a first local oscillator signal frequency of 1.6 GHz, the signal output by the first mixer 250 for an input signal having a frequency f will include frequency components $|f-LO_1|$ as well as $|f+LO_1|$. Therefore, the 1.2 GHz L5 band signal in the first RF signal portion 230 will contribute both a 0.4 GHz ($|1.2$ GHz$-1.6$ GHz$|$) signal as well as a 2.8 GHz ($|1.2$ GHz$+1.6$ GHz$|$) signal to the first downconversion output signal 232. The 0.4 GHz (400 MHz) L5 signal is the intended signal as it can then be downconverted using the second mixer 252 and a second local oscillator frequency of 400 MHz to bring the intended signal closer to DC, and the 400 MHz second local oscillator signal can be generated by dividing either the first local oscillator signal or the single local oscillator signal by four (4), for example, using frequency divider 248, which is equivalent to dividing the 3.2 GHz main oscillator signal by eight (8). In a similar manner, the jammer signal JA in the first RF signal portion 230 will contribute both a 0.4 GHz jammer downconversion product and a 3.6 GHz jammer downconversion product (not shown) to the first downconversion output signal 232. Since the 400 MHz L5 signal is the intended first downconverted L5 signal, it can be separated from the other frequencies described above, namely the 2.8 GHz L5 downconversion product and 3.6 GHz JA downconversion product signals using, for example, a filter (not illustrated for ease of illustration) disposed between the first mixer 250 and the second mixer 252. However, while the 2.8 GHz and 3.6 GHz downconversion products can be filtered out using filter 251, as shown in graph 262a, the 400 MHz jammer downconversion product cannot be filtered out from the 400 MHz L5 intended signal. It is understood that the JA downconversion product is illustrated schematically in graph 262a as smaller than the L5 intended signal for ease of illustration, however, depending on the situation, the JA downconversion product may be less than or greater than the L5 intended signal in power. While subsequent downconversion of the first downconversion output signal 232 by mixing with second local oscillator having a frequency of $LO_2$ can shift the 400 MHz L5 downconversion product to DC to generate second downconversion output signal 233, interference from the jammer downconversion product at frequency JA will significantly degrade the desired L5 signal. Furthermore, additional signal components can include jammer image signal components, not discussed here for ease of explanation, which may also interfere with the desired L5 signal.

The second RF signal portion 234 along the second signal path 215 can be downconverted once, since the local oscillator frequency is optimized for the frequency band of the second RF signal portion 234, illustrated here as a 1.6 GHz L1 band. As shown in graph 266, the second RF signal portion 234 includes the 1.6 GHz L1 band component as well as the same jammer signal JA component from graph 260. After undergoing a single downconversion using single mixer 254 having a local oscillator frequency at 1.6 GHz, the second RF signal portion 234 is downconverted to the single downconversion output signal 236. The 1.6 GHz L1 signal shown in graph 266 will contribute the DC L1 downconversion product illustrated in graph 268 as well as a 3.2 GHz L1 downconversion product (not shown), where the illustrated DC L1 downconversion product is the intended or desired signal. The jammer signal JA will contribute the 0.4 GHz (400 MHz) JA downconversion product illustrated in graph 268 as well as a 3.6 GHz JA downconversion product (not shown), where both the JA downconversion products are well isolated from the desired DC L1 downconversion product. Furthermore, jammer image downconversion products may also exist. All of the jammer signal JA and jammer image downconversion products are well separated from the desired DC L1 downconversion product. It is understood that, for ease of illustration, not all downconversion products are illustrated and that undesired signals can be filtered out from the single downconversion output signal 236 prior to subsequent processing, including subsequent digital preprocessing and/or analog to digital conversion.

After downconversion, both the second downconversion output signal 233 and the single downconversion output signal 236 can be processed further before undergoing digital signal processing in a digital signal processor such as digital signal processor 170 with reference to FIG. 1. Such further processing can be performed by one or more hardware blocks and/or components labeled in FIG. 2A as filter 270 and 272. Filter 270 and 272 can perform filtering to isolate a desired in-band signal, such as the illustrated L1 and L5 signals, from any jammer frequencies. The outputs of filter 270 and filter 272 may each then proceed to an ADC for each signal path.

Figure 2B:
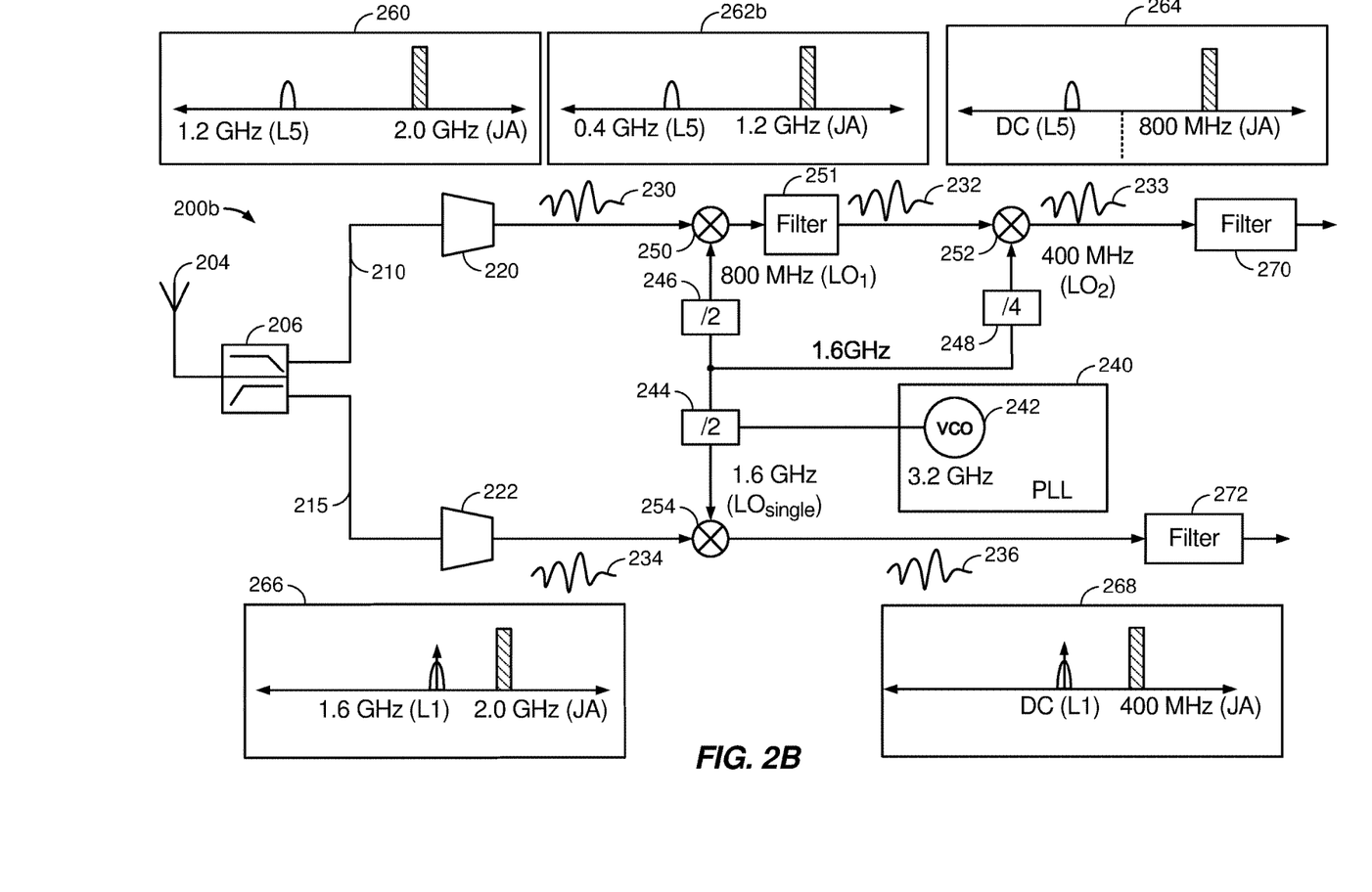
FIG. 2B illustrates one example of a jammer avoid scenario where the intended signal undergoing double downconversion avoids the jammer by use of a better first and second local oscillator frequency combination than the combination illustrated in FIG. 2A.

FIG. 2B illustrates one example of a jammer avoid scenario where the intended signal undergoing double downconversion avoids the jammer by use of a better first and second local oscillator frequency combination than the combination illustrated in FIG. 2A. Similar to the example shown in FIG. 2A, the first RF signal portion 230 includes a 1.2 GHz L5 signal component as well as a 2.0 GHz jammer JA signal component. However, in the example illustrated in FIG. 2B, the first mixer 250 mixes the first RF signal portion 230 with an 800 MHz first local oscillator signal (as opposed to the 1.6 GHz first local oscillator signal of FIG. 2A). The first downconversion output signal 232 generated by the downconversion of the first RF signal portion 230 using the 800 MHz $LO_1$ signal includes the L5 downconversion product at 0.4 GHz (1.2 GHz-0.8 GHz) illustrated in graph 262b as well as an L5 downconversion product at 2.0 GHz (1.2 GHz+0.8 GHz) (not shown). Similarly, the first downconversion output signal 232 includes the illustrated JA downconversion product at 1.2 GHz (2.0 GHz-0.8 GHz) as well as a JA downconversion product at 2.8 GHz (2.0 GHz+0.8 GHz) (not shown). Furthermore, additional downconversion products from a jammer image may also be present. As can be seen from graph 262b, unlike the example of FIG. 2A, many of the JA downconversion products as well as the jammer image downconversion products are all well separated from the intended 0.4 GHz (400 MHz) L5 downconversion product. As such, these jammer and jammer image components in first downconversion output signal 232 can be filtered out of the signal (using a filter, for example filter 251 with reference to FIG. 2A) before or after the second downconversion without interference with the intended signal. Downconverter 200b can then perform a second downconversion of the first downconversion output signal 232 on the first signal path 210 by mixing the first downconversion output signal 232 with the 400 MHz ($LO_2$) second local oscillator signal to generate the second downconversion output signal 233 on the first signal path 210. As shown in graph 264, even if the 1.2 GHz (JA) jammer signal is not filtered out prior to mixing the first downconversion output signal 232 using the second mixer 252 with the 400 MHz ($LO_2$) second local oscillator signal, the second downconversion output signal 233 includes the intended DC L5 downconversion product and an 800 MHz (JA) jammer downconversion product. The desired DC L5 signal is separated in frequency from the JA signal in the second downconversion output signal 233.

As can be seen from the downconverter 200b illustrated in FIG. 2B, the first local oscillator signal having frequency $LO_1$ and the second local oscillator signal having frequency $LO_2$ can be derived from the main oscillator using frequency divider 244 to divide the main oscillator signal frequency by two (2) to generate the 1.6 GHz ($LO_{single}$) single local oscillator signal, using frequency divider 246 to further divide the single local oscillator signal by two (2) to generate the 800 MHz ($LO_1$) first local oscillator signal, and using frequency divider 248 to further divide the frequency ($LO_{single}$) of the single local oscillator signal by four (4) to generate the 400 MHz ($LO_2$) second local oscillator signal. By performing a first downconversion in the example of FIG. 2B using an 800 MHz $LO_1$ instead of the 1.6 GHz $LO_1$ signal shown in FIG. 2A, the 2.0 GHz (JA) jammer signal was avoided in the first downconversion output signal 232 as well as the second downconversion output signal 233.

In another example similar to that illustrated in FIG. 2B, suppose $LO_1$ was set to 400 MHz where frequency divider 246 is configured to divide the 1.6 GHz signal by four (4) and that $LO_2$ was set to 800 MHz where frequency divider 248 is configured to divide the 1.6 GHz signal by two (2). In such a case, the first downconversion output signal 232 would include two L5 downconversion products at 800 MHz, which would be the intended signal, and at 1.6 GHz (not illustrated). The first downconversion output signal 232 would also include two JA downconversion products at 1.6 GHz and at 2.4 GHz. The JA downconversion products are well separated from the desired 800 MHz L5 downconversion product. The second downconversion using the second mixer with the 800 MHz $LO_2$ would shift the desired 800 MHz L5 downconversion product to DC such that the second downconversion output signal 233 would include the desired DC L5 component. If left unfiltered, the 1.6 GHz and 2.4 GHz JA signals would shift after the second downconversion to contribute downconversion products in the second downconversion output signal 233 at 800 MHz, as well as other JA downconversion products (not illustrated), all of which are well separated from the desired DC L5 component. All of these JA signals can then be filtered using filter 270 to isolate the DC L5 component.

It is understood that in the examples provided and discussed above with reference to both FIGS. 2A and 2B, the frequency examples were approximate for ease of illustration, and that actual frequency values may slightly differ. For example, the L1 band described above as being around 1.6 GHz may in fact be a frequency band centered around 1.57542 GHz. The frequency ($LO_{single}$) of the single oscillator may also slightly differ from 1.6 GHz and may instead actually be a 1.59 GHz oscillator signal. In another example, the L5 band described above as being around 1.2 GHz may in face be a frequency band centered around 1.17645 GHz. The first oscillator signal frequency $LO_1$ and/or second oscillator signal frequency $LO_2$ described as being at 400 MHz or 800 MHz may actually be at 397.5 MHz or 795 MHz. The final signal resulting from either the double downconversion or the single downconversion may be an IF signal that is at ZIF, VLIF, or LIF. Additionally, or alternatively, the IF signal may be less than 50 MHz, for example, 30 MHz or less, 20 MHz or less, and/or 15 MHz or less. It is understood that signals described as DC for simplicity may actually be signals having an IF frequency.

Figure 3:
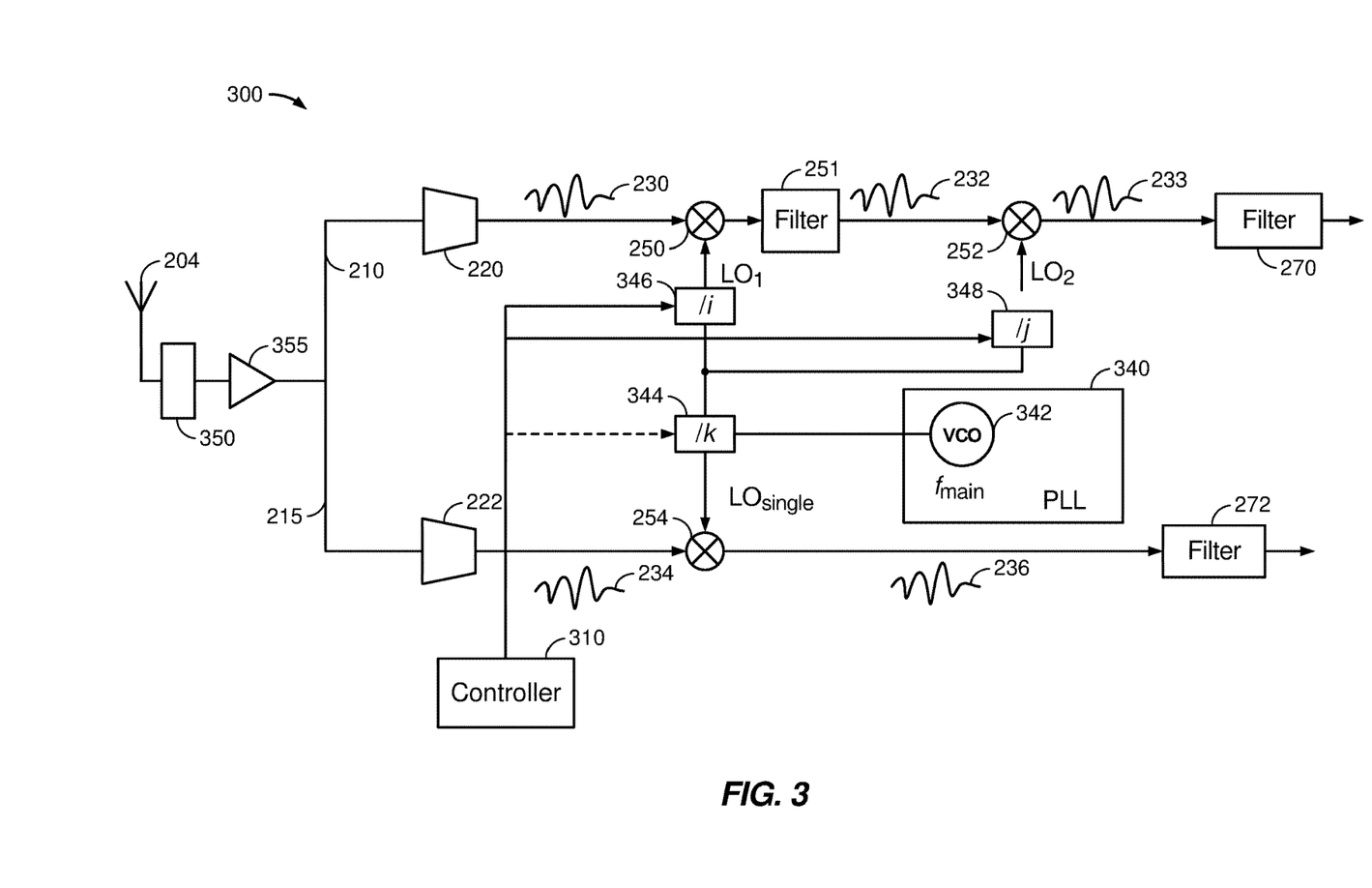
FIG. 3 illustrates a downconverter in accordance with various aspects of this disclosure.

FIG. 3 illustrates a downconverter 300 similar to the downconverters 200a of FIG. 2A and 200b of FIG. 2B. An RF receiver, such as receiver 130 with reference to FIG. 1, can comprise the illustrated downconverter 300. The downconverter 300 includes a first signal path 210 for a first RF signal portion of a signal received by antenna 204. The downconverter 300 further includes a second signal path 215 for a second RF signal portion 234. In the illustrated example of FIG. 3, input RF signals received by the antenna 204 are first passed through a filter, for example, a dual-band bandpass filter 350 disposed between the antenna 204 followed by a wideband LNA 355. The dual-band bandpass filter 350 can be configured to filter the input RF signal before the input RF signal is amplified by the wideband LNA 355. While the illustrated implementation does not include a diplexer as illustrated in FIGS. 2A and 2B, it is understood that FIG. 3 could, additionally or alternatively to the dual-band bandpass filter 350 and the wideband LNA 355, include a diplexer. One example of a dual-band bandpass filter 350 is a dual-band SAW filter. The amplifier 220 is optionally disposed after the wideband LNA 355 and before the first mixer 250. An other amplifier 222 is optionally disposed after the wideband LNA 355 and before the single mixer 254. In the illustrated implementation, since the first amplifier, wideband LNA 355 is a LNA, amplifiers 220 and 222 can be, for example, transconductance amplifiers. In the illustrated implementation, antenna 204 can be a single antenna or can include two or more antennas. As illustrated, the dual-band bandpass filter 350 and the wideband LNA 355 are configured to receive an input RF signal from antenna 204 (illustrated as a single antenna) and to provide an output connected to the first signal path 210 and the second output comprising the second signal path 215. It is understood that the first signal path 210 includes the path traveled by signals 230, 232, and 233, and that the second signal path 215 includes the path traveled by signals 234 and 236. It is also understood that while dual-band bandpass filter 350 is shown before wideband LNA 355, additionally or alternatively, various kinds of filters can also be placed after wideband LNA 355.

As illustrated in FIGS. 2A and 2B, depending on the frequency of a jammer, certain double downconversion combinations (that is, particular frequency values of both $LO_1$ and $LO_2$) can help to avoid a jammer while other double downconversion combinations may cause the jammer or a jammer image to fall directly onto the desired signal. As such, it can be helpful to provide for a downconverter 300 where the $LO_1$ and $LO_2$ values can be dynamically adjusted, for example, based on the detection of a jammer within a certain frequency. As such, downconverter 300 includes a controller 310 configured to determine a first oscillator divider value i and a second oscillator divider value j based on jammer frequency information. In some implementations, the jammer frequency information can be received from a WWAN transceiver 404 or WLAN transceiver 406 or can be determined by the SPS receiver 408 or other SPS-related hardware with reference to FIG. 4. The controller 310 hence can be configured to determine the divider values i and j and to control and/or communicate said divider values to a first frequency divider 346 and a second frequency divider 348, where frequency dividers 346 and 348 are frequency dividers that can change to output different integer fractions of an input oscillator signal. Although FIG. 3 is illustrated to show frequency dividers 346 and 348 dividing the frequency of the oscillator signal output by frequency divider 344, it is understood that downconverter 300 can alternatively be designed such that frequency dividers 346 and 348 divide the frequency $f_{main}$ of the signal output by the VCO 342 of the PLL 340, and as such, frequency divider 344 is optional. A dashed line is shown from controller 310 to frequency divider 344 to illustrate that, optionally, controller 310 can also be configured to control the divider value used to generate the single local oscillator frequency $LO_{single}$ which will be used to perform a single downconversion of the second RF signal portion 234. However, it is understood that since the frequency $LO_{single}$ can be optimized to downconvert the desired band in the second RF signal portion 234, dynamic control of frequency divider 344 is optional.

The first frequency divider 346 can be configured to output a first local oscillator frequency $LO_1$ by dividing the frequency of an oscillator signal by the first oscillator divider value determined by the controller. Similarly, the second frequency divider 348 is configured to output a second local oscillator frequency $LO_2$ by dividing the frequency of the oscillator signal by the second oscillator divider value determined by the controller. As illustrated, the oscillator signal that is frequency divided by the frequency dividers 346 and 348 is the output of the frequency divider 344, however, it is understood that the oscillator signal could have been the main oscillator signal output by VCO 342. Also, it is understood that while both frequency dividers 346 and 348 are shown dividing the frequency of the same signal, it is understood that they each may divide the frequency of a different oscillator signal to generate $LO_1$ and/or $LO_2$. As such, the controller 310, oscillator signal VCO 342 having frequency $f_{main}$ and/or having frequency $LO_{single}$, the first frequency divider 346, and the second frequency divider 348 are together configured such that the frequency of the first local oscillator frequency and the second local oscillator frequency are together appropriate for downconverting an L5 or L2 band to an IF that is one of ZIF, VLIF, LIF, or an IF less than 50 MHz.

The downconverter 300 further includes the first mixer 250 configured to downconvert the first RF signal portion 230 on the first signal path 210 by mixing the first RF signal portion 230 with the first local oscillator signal $LO_1$ to generate the first downconversion output signal 232 on the first signal path 210. The downconverter 300 further includes the second mixer configured to downconvert the first downconversion output signal 232 on the first signal path 210 by mixing the first downconversion output signal with the second local oscillator signal to generate a second downconversion output signal 233 on the first signal path 210.

As illustrated, the downconverter 300 includes a filter 270, for example a band-pass filter or low pass filter, to isolate an in-band signal from the jammer signal. In one example, the in-band signal can include an L5 signal that has been converted to a frequency band at or near DC. In various examples, the filter 270 can be a band pass filter or a low pass filter. In an implementation using a band pass filter, it is understood that the desired in-band signal may not be placed at DC, but may rather be placed above DC in an IF band. Furthermore, as explained above with reference to FIG. 2A, included in filter 270 or additional to filter 270, one or more digital pre-processors can be included to perform one or more digital pre-processing steps before signals are output to a digital signal processor.

The downconverter 300 further includes the single mixer 254 configured to downconvert the second RF signal portion 234 on the second signal path 215 by mixing the second RF signal portion 234 with a single local oscillator signal having frequency $LO_{single}$. The $LO_{single}$ can optionally be, for example, generated by frequency divider 344 which is configured to divide the frequency of the main oscillator signal having a frequency $f_{main}$ by either a fixed oscillator divider value or an oscillator divider value that can be controlled and adjusted by the controller 310.

FIG. 4 illustrates an exemplary mobile device that may be used to determine position and to provide navigation to a user using navigation signals from one or more satellites. The SPS receiver 408 of mobile device 400 can include a downconverter similar to that described above with reference to FIGS. 2A, 2B, and 3 prior to digital signal processing to be performed by, for example, digital signal processor 170 with reference to FIG. 1. Functions of the digital signal processor can include demodulation, de-interleaving, decoding data, stripping secondary code, and/or measuring data and/or pilot signals contained in the satellite signals. FIG. 4 is a block diagram illustrating various components of an exemplary mobile device 400. For the sake of simplicity, the various features and functions illustrated in the box diagram of FIG. 4 are connected together using a common bus, which is meant to represent that these various features and functions are operatively coupled together. Those skilled in the art will recognize that other connections, mechanisms, features, functions, or the like, may be provided and adapted as desired to operatively couple and configure an actual portable wireless device. Further, it is also recognized that one or more of the features or functions illustrated in the example of FIG. 4 may be further subdivided or two or more of the features or functions illustrated in FIG. 4 may be combined.

The mobile device 400 may include one or more wireless wide area network (WWAN) transceiver(s) 404 that may be connected to one or more antennas 402. The WWAN transceiver 404 comprises suitable devices, hardware, and/or software for communicating with and/or detecting signals to/from WWAN access points and/or directly with other wireless devices within a network. In one aspect, the WWAN transceiver 404 may comprise a code-division multiple access (CDMA) communication system suitable for communicating with a CDMA network of wireless base stations (such as base station 104 of FIG. 1); however in other aspects, the wireless communication system may comprise another type of cellular telephony network, such as, for example, time-division multiple access (TDMA), time division synchronous code division multiple access (TD-SCDMA), LTE, or Global System for Mobile Communication (GSM). Additionally, any other type of wide area wireless networking technologies may be used, for example, WiMAX (IEEE 802.16), etc. The mobile device 400 may also include one or more wireless local area network (WLAN) transceivers (such as illustrated WLAN transceiver 406) that may be connected to one or more antennas 402. The WLAN transceiver 406 comprises suitable devices, hardware, and/or software for communicating with and/or detecting signals to/from WLAN access points and/or directly with other wireless devices within a network. In one aspect, the WLAN transceiver 406 may comprise a Wi-Fi (IEEE 802.11x) communication system suitable for communicating with one or more wireless access points; however in other aspects, the WLAN transceiver 406 comprise another type of local area network or personal area network (PAN). Additionally, any other type of wireless networking technologies may be used, for example, Ultra Wide Band, Bluetooth, ZigBee, wireless USB, etc. In some examples, the transmission of WWAN and/or WLAN signals by the mobile device 400 can introduce a jammer signal at a jammer frequency that can jam received satellite signals by the SPS receiver 408.

An SPS receiver 408 may also be included in the mobile device 400. The SPS receiver 408 may be connected to the one or more antennas 402 for receiving satellite signals. The SPS receiver 408 may comprise any suitable hardware and/or software for receiving and processing SPS signals. For example, the SPS receiver 408 may include components similar to those of receiver 130 with reference to FIG. 1 which may include a downconverter similar to downconverters 200*a*, 200*b*, 300 with reference to FIGS. 2A, 2B, and 3 (where antenna(s) 402 may correspond to antenna 204 with reference to FIGS. 2A, 2B, and 3). The SPS receiver 408 requests information and operations as appropriate from the other systems, and performs the calculations used to determine the mobile device's 400 position using measurements obtained by any suitable SPS algorithm.

A motion sensor 412 may be coupled to a processor 410 to provide movement and/or orientation information, which is independent of motion data derived from signals, received by the WWAN transceiver 404, the WLAN transceiver 406 and the SPS receiver 408.

By way of example, the motion sensor 412 may utilize an accelerometer (e.g., a microelectromechanical systems device), a gyroscope, a geomagnetic sensor (e.g., a compass), an altimeter (e.g., a barometric pressure altimeter), and/or any other type of movement detection sensor. Moreover, the motion sensor 412 may include a plurality of different types of devices and combine their outputs in order to provide motion information. For example, the motion sensor 412 may use a combination of a multi-axis accelerometer and orientation sensors to provide the ability to compute positions in 2-D and/or 3-D coordinate systems.

The processor 410 may be connected to the WWAN transceiver 404, WLAN transceiver 406, the SPS receiver 408 and the motion sensor 412. In one example, the processor 410 may determine a jammer frequency, for example, by receiving jammer frequency information from the WWAN transceiver 404 and/or the WLAN transceiver 406. The processor 410 may then transmit the jammer frequency information to the SPS receiver 408 to enable the SPS receiver to adjust divider values so that a main oscillator frequency can be divided to produce a first local oscillator frequency and a second local oscillator frequency as described elsewhere herein. The processor 410 may include one or more microprocessors, microcontrollers, and/or digital signal processors that provide processing functions, as well as other calculation and control functionality. The processor 410 may also include memory 414 for storing data and software instructions for executing programmed functionality within the mobile device 400. The memory 414 may be on-board the processor 410 (e.g., within the same integrated circuit package), and/or the memory may be external memory to the processor and functionally coupled over a data bus.

A number of software modules and data tables may reside in memory 414 and be utilized by the processor 410 in order to manage both communications and positioning determination functionality. As illustrated in FIG. 4, memory 414 may include and/or otherwise receive a navigation application 418 for providing navigation instructions to a user, and a positioning module 428. Navigation application 418 and positioning module 428 are examples of software components which may use positioning computed using the received satellite signals by the SPS receiver 408. One should appreciate that the organization of the memory contents as shown in FIG. 4 is merely exemplary, and as such the functionality of the modules and/or data structures may be combined, separated, and/or be structured in different ways depending upon the implementation of the mobile device 400. Furthermore, in one embodiment, a battery 460 may be coupled to the processor 410, wherein the battery 460 may supply power to the processor 410 and various other modules and components located on the mobile device 400 through appropriate circuitry and/or under control of the processor 410.

The navigation application 418 may be a process running on the processor 410 of the mobile device 400, which requests position information from the positioning module 428. Based upon the position information received from the positioning module 428, the navigation application 418 can provide navigation instructions in accordance with route data for a given route to a given destination.

The positioning module 428 can be capable of determining a position based on inputs from wireless signal measurements from WWAN transceiver 404, signal measurements WLAN transceiver 406, data received from SPS receiver 408, and/or data from motion sensor 412.

While the modules shown in FIG. 4 are illustrated in the example as being contained in the memory 414, it is recognized that in certain implementations such procedures may be provided for or otherwise operatively arranged using other or additional mechanisms. For example, all or part of the positioning module 428 and/or the navigation application 418 may be provided in firmware. Additionally, while in this example the positioning module 428 and the navigation application 418 are illustrated as being separate features, it is recognized, for example, that such procedures may be combined together as one procedure or perhaps with other procedures, or otherwise further divided into a plurality of sub-procedures.

In many embodiments, the memory 414 can include many different kinds of memory and is only illustrated schematically. Memory 414 can include a non-transitory computer readable medium, which may include a read-only memory (ROM) device. The memory 414 may comprise software elements, including an operating system, device drivers, executable libraries, and/or other code, such as the illustrated navigation application 418. The navigation application can comprise one or more computer programs provided by various embodiments, and/or may be designed to utilize positioning computations resulting from analog and digital signal processing performed in the SPS receiver 408 as described in FIGS. 1, 2A, 2B, 3, and in FIG. 5 further below.

Merely by way of example, one or more procedures described with respect to the method(s) discussed above might be implemented as code and/or instructions executable by a computer (and/or a processor within a computer), in an aspect, then, such code and/or instructions may be used to configure and/or adapt a general purpose computer (or other device) to perform one or more operations in accordance with the described methods.

Figure 5:
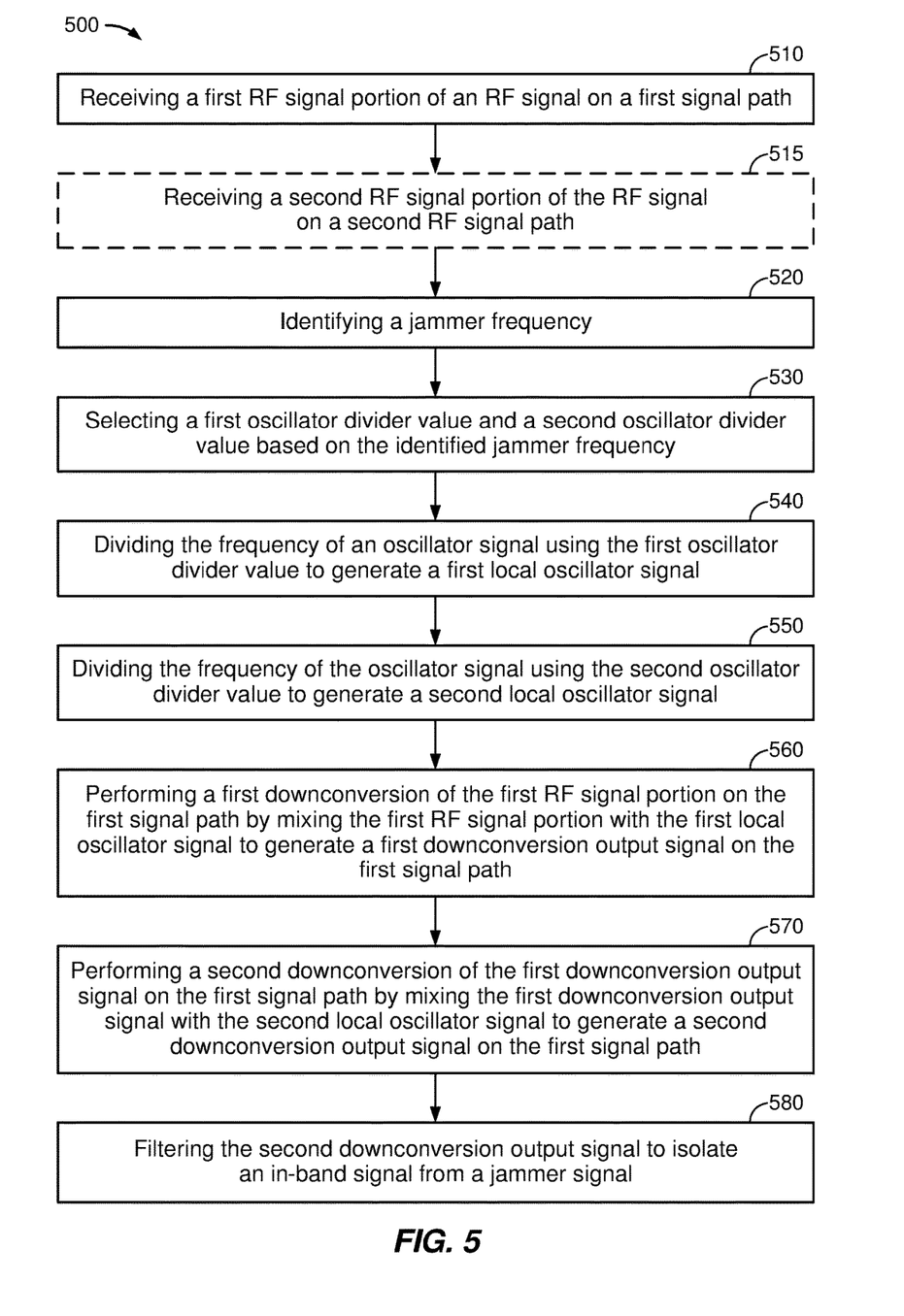
FIG. 5 illustrates a method for processing a radio frequency (RF) signal received at one or more antennae.

As described elsewhere in greater detail, such instructions stored on a non-transitory computer readable medium for execution by one or more processors of a mobile device may, in various implementations, include instructions to perform operations corresponding to any of the functions disclosed herein, for example those illustrated in FIG. 5. The operations may include any aspects described herein, for example any combination of the blocks illustrated with reference to FIG. 5.

The mobile device 400 may include a user interface 450, which provides any suitable interface systems, such as a microphone/speaker 452, keypad 454, and display 456 that allows user interaction with the mobile device 400. The microphone/speaker 452 provides for voice communication services using the WWAN transceiver 404 and/or the WLAN transceiver 406. Although illustrated as a single device, it is understood that microphone/speaker 452 may comprise a separate microphone device and a separate speaker device. The keypad 454 comprises any suitable buttons for user input. The display 456 comprises any suitable display, such as, for example, an liquid crystal display, and may further include a touchscreen display for additional user input modes. The user interface 450 is illustrated as a hardware user interface 450, however, can also be understood to include a graphical user interface displayed on a touchscreen allowing output to a user and receipt of input from the user. Input from, and output to, user can be mediated through the user interface 450 such that the mobile device, for example the processor 410 or other components, can receive user input from the user interface 450 and provide output to the user to the user interface 450.

The processor 410 may include any form of logic suitable for performing at least the techniques provided herein, for example the method described with reference to FIG. 5. For example, the processor 410 (which may include one or more processors within the mobile device 400) can be coupled to the memory 414, user interface (including, for example, keypad 454, display 456, microphone/speaker 452, or a combination thereof), SPS receiver 408, positioning module 428, and the wireless transceiver (such as WWAN transceiver 404 and/or WLAN transceiver 406). The one or more processors and the memory can together be configured to, for example, based on instructions in the memory 414 perform any of the aspects of method 500 described below with reference to FIG. 5.

As used herein, the mobile device 400 may be any portable or movable device or machine that is configurable to acquire wireless signals transmitted from, and transmit wireless signals to, one or more wireless communication devices or networks. As shown in FIG. 4, the mobile device 400 may be representative of such a portable wireless device. Thus, by way of example but not limitation, the mobile device 400 may include a radio device, a cellular telephone device, a tablet or other computing device, a personal communication system (PCS) device, a position-capable wearable device such as a wristwatch or other position-capable wearable, or other like movable wireless communication equipped device, appliance, or machine, or an Internet of things (IoT) device that is easily moved due to its size, even if generally stationary when deployed. The term "mobile device" is also intended to include devices which communicate with a personal navigation device (PND), such as by short-range wireless, infrared, wire line connection, or other connection, regardless of whether satellite signal reception, assistance data reception, and/or position-related processing occurs at the device or at the PND. Also, "mobile device" is intended to include all devices, including wireless devices, computers, laptops, etc. which are capable of communication with a server, such as via the Internet, Wi-Fi, or other network, and regardless of whether satellite signal reception, assistance data reception, and/or position-related processing occurs at the device, at a server, or at another device associated with the network. Any operable combination of the above is also considered a "mobile device."

As used herein, the term "wireless device" may refer to any type of wireless communication device, which may transfer information over a network and also have position determination and/or navigation functionality. The wireless device may be any cellular mobile terminal, PCS device, personal navigation device, laptop, personal digital assistant, or any other suitable mobile device capable of receiving and processing network and/or SPS signals.

FIG. 5 illustrates a method 500 for processing an RF signal received at one or more antennae. In one example, the method 500 can be performed by the downconverter 300 with reference to FIG. 3. The method 500 commences at block 510 with receiving a first RF signal portion of the RF signal on a first signal path. The method 500 may continue either to optional block 515 or to block 520. Hence, in one alternative, the method 500 continues optionally at block 515 with receiving a second RF signal portion of the RF signal on a second signal path. In one implementation, the RF signal can be received at a single antenna and separated into the first RF signal portion and the second RF signal portion using a diplexer similar to that described above with reference to FIG. 3. Alternatively, two different antennae can be used to provide the first RF signal portion on the first signal path and the second RF signal portion on the second signal path. In some implementations, the first RF signal portion and the second RF signal portion comprise two different bands of a given type of RF signal. In one such example, the RF signal can include a GNSS satellite signal received by a GNSS receiver on Earth. While the examples described above with reference to FIGS. 2A, 2B, and 3 described the first RF signal portion as comprising an L5 band for GPS, it is understood that this is only one example. The first RF signal portion could alternatively be one of an L2 or L5 band for GPS, a G2 band for GLONASS, an E5 band for Galileo, and a B2 band for Beidou, to name a few examples.

With continued reference to blocks 510 and 515, receiving the first RF signal portion and receiving the second RF signal portion can include receiving an RF signal at one or more antennae, where the received RF signal includes receiving a navigation signal from a navigation satellite transmitting signals in a first band and the (same) navigation satellite transmitting signals in a second band different from the first band. In various examples, the first band can include an L2 or an L5 band for GPS, a G2 band for GLONASS, an E5 band for Galileo, and a B2 band for Beidou. The second band can include an L1 band for GPS, a G1 band for GLONASS, an E1 band for Galileo, and a B1 band for Beidou. Means for performing the functionality of block 510 and/or block 515 can, but not necessarily, include, for example, any combination of antenna 204, dual-band bandpass filter 350, wideband LNA 355, diplexer 206, amplifier 220, amplifier 222, first signal path 210 and second signal path 215 with reference to FIGS. 2A, 2B, and/or 3.

The method 500 continues at block 520 with identifying a jammer frequency. The jammer frequency can be identified through various methods. In one example, the jammer frequency can be a frequency of signals transmitted by another RF system of the mobile device 400, for example WWAN transceiver 404 and/or WLAN transceiver 406 with reference to FIG. 4. Hence, in one example, jammer frequency information can be received from either WWAN transceiver, WLAN transceiver, and/or processor 410 with reference to FIG. 4. In another example, the SPS receiver 408 may have circuitry capable of detecting the jammer signal to thereby identify the jammer frequency. Means for performing the functionality of block 520 can, but not necessarily, include, for example, any combination of controller 310 with reference to FIG. 3, WWAN transceiver 404, WLAN transceiver 406, SPS receiver 408, and processor 410 with reference to FIG. 4

The method continues at block 530 with selecting a first oscillator divider value and a second oscillator divider value based on the identified jammer frequency. The selected first oscillator divider value is to be used to divide the frequency of an oscillator signal at block 540, such as a main oscillator signal or another oscillator signal derived from the main oscillator signal, to generate a first local oscillator signal. The selected second oscillator divider value is to be used to divide the frequency of an oscillator signal at block 550, such as a main oscillator signal or another oscillator signal derived from the main oscillator signal, to generate a second local oscillator signal. In one example, the first oscillator divider value and/or the second oscillator divider value can be determined or selected based on a lookup table which identifies divider values based on the identified jammer frequency. Means for performing the functionality of block 530 can, but not necessarily, include, for example, any combination of controller 310, first frequency divider 346, and second frequency divider 348 with reference to FIG. 3 and processor 410 with reference to FIG. 4.

The method continues at block 540 with dividing the frequency of an oscillator signal using the first oscillator divider value to generate a first local oscillator signal. Means for performing the functionality of block 540 can, but not necessarily, include, for example, any combination of controller 310, first frequency divider 346, PLL 340, VCO 342, and frequency divider 344 with reference to FIG. 3.

The method continues at block 550 with dividing the frequency of the oscillator signal using the second oscillator divider value to generate a second local oscillator signal. With reference to both blocks 540 and 550, the oscillator signal that is divided to generate the first local oscillator signal and the oscillator signal that is divided to generate the second local oscillator signal may be the same oscillator signal (for example a main oscillator signal or a same oscillator signal derived from the main oscillator signal) or may be different oscillator signals. Means for performing the functionality of block 540 can, but not necessarily, include, for example, any combination of controller 310, second frequency divider 348, PLL 340, VCO 342, and frequency divider 344 with reference to FIG. 3.

The method 500 continues at block 560 with performing a first downconversion of the first RF signal portion on the first signal path by mixing the first RF signal portion with the first local oscillator signal to generate a first downconversion output signal on the first signal path. Means for performing the functionality of block 560 can, but not necessarily, include, for example, any combination of first signal path 210, first mixer 250, PLL 340, frequency divider 344, and first frequency divider 346 with reference to FIG. 3.

The method 500 continues at block 570 with performing a second downconversion of the first downconversion output signal with the second local oscillator signal to generate a second downconversion output signal on the first signal path. Means for performing the functionality of block 570 can, but not necessarily, include, for example, any combination of first signal path 210, second mixer 252, PLL 340, frequency divider 344, and second frequency divider 348 with reference to FIG. 3.

The method 500 continues at block 580 with filtering the second downconversion output signal to isolate an in-band signal from the jammer signal. In some implementations the in-band signal is an IF signal, for example, at or near ZIF, VLIF, or LIF. Additionally, or alternatively, the IF signal may be less than 100 MHz, for example, 30 MHz or less, 20 MHz or less, and/or 15 MHz or less. In implementations where the in-band signal on the first signal path is a GNSS signal, the in-band signal can include, an L2 or L5 band for GPS, a G2 band for GLONASS, an E5 band for Galileo, and a B2 band for Beidou, to name a few examples.

Optionally, the method may further include performing a single downconversion of the second RF signal portion on the second signal path by mixing the first RF signal portion with a single local oscillator signal. Such a single local oscillator signal can optionally be generated by frequency dividing the main oscillator signal using either a fixed divider value, or a divider value that may be controlled using a controller, as described with reference to FIG. 3. The single downconversion output signal can, in some implementations, include an in-band signal on the second signal path that is an IF signal, for example, at or near ZIF, VLIF, or LIF. In implementations where the in-band signal on the second signal path is a GNSS signal, the in-band signal can include, by way of example, an L1 band for GPS, a G1 band for GLONASS, an E1 band for Galileo, and a B1 band for Beidou.

Prior to block 510, the method can include receiving the RF signal at an antenna and optionally filtering the RF signal received at the antenna using a dual-band bandpass filter (for example, dual-band bandpass filter 350 with reference to FIG. 3) and then, optionally, subsequently amplifying the filtered RF signal received at the antenna using a wideband LNA (such as wideband LNA 350, which may serve as a means for amplifying the RF signal). Although such optional filtering performed before any of the downconversions discussed above, for example first downconversion (using first mixer 250 with reference to FIGS. 2A and 2B and/or block 560 of FIG. 5) or single downconversion (using single mixer 254 with reference to FIGS. 2A and 2B), can help reduce interference by the jammer signal at the jammer frequency, the jammer signal may still cause issues because the desired signal may be several orders of magnitude weaker than the jammer signal. In such a situation, given how little power there is in the desired signal, and how much power there is in the jammer, realistic filters may still not be able to sufficiently attenuate the jammer to prevent the issues described earlier herein. Alternatively, the method can include filtering the RF signal received at the antenna using a dual-band bandpass filter both before amplifying the RF signal and again using an other dual-band bandpass filter after amplifying the RF signal.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, algorithms, structures, and techniques have been shown without unnecessary detail in order to avoid obscuring the embodiments. This description provides example embodiments only, and is not intended to limit the scope, applicability, or configuration of the disclosure. Rather, the preceding description of the embodiments will provide those skilled in the art with an enabling description for implementing embodiments of the disclosure. Various changes may be made in the function and arrangement of elements without departing from the spirit and scope of the disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example.

Having described several embodiments, various modifications, alternative constructions, and equivalents may be used without departing from the spirit of the disclosure. For example, the above elements may merely be a component of a larger system, wherein other rules may take precedence over or otherwise modify the application of the embodiments described herein. Also, a number of steps may be undertaken before, during, or after the above elements are considered. Accordingly, the above description does not limit the scope of the disclosure.

What is claimed is:

1. A method for processing a radio frequency (RF) signal received at one or more antennae, the method comprising:
   receiving a first RF signal portion of the RF signal on a first signal path;
   identifying a jammer frequency;
   selecting a first oscillator divider value and a second oscillator divider value based on the identified jammer frequency;
   dividing the frequency of an oscillator signal using the first oscillator divider value to generate a first local oscillator signal;
   dividing the frequency of the oscillator signal using the second oscillator divider value to generate a second local oscillator signal;
   performing a first downconversion of the first RF signal portion on the first signal path by mixing the first RF signal portion with the first local oscillator signal to generate a first downconversion output signal on the first signal path;
   performing a second downconversion of the first downconversion output signal on the first signal path by mixing the first downconversion output signal with the second local oscillator signal to generate a second downconversion output signal on the first signal path; and
   filtering the second downconversion output signal to isolate an in-band signal from a jammer signal.

2. The method of claim 1, further comprising:
   receiving a second RF signal portion of the RF signal on a second signal path; and
   performing a single downconversion of the second RF signal portion on the second signal path by mixing the first RF signal portion with a single local oscillator signal.

3. The method of claim 2, wherein the single local oscillator signal is generated by dividing a frequency of a main oscillator signal using a fixed divider value.

4. The method of claim 1, further comprising amplifying the RF signal received at the one or more antennae using a wideband low noise amplifier.

5. The method of claim 4, further comprising filtering the RF signal received at the one or more antennae using a dual-band bandpass filter before amplifying the RF signal.

6. The method of claim 1, wherein receiving the RF signal at the one or more antennae comprises receiving a navigation signal from a same navigation satellite, wherein the same navigation satellite transmits signals in a first band and in a second band different from the first band.

7. The method of claim 6 wherein the first band is an L2 band or an L5 band and the second band is an L1 band.

8. A radio frequency (RF) receiver comprising:
   a first signal path to receive a first RF signal portion;

a controller configured to determine a first oscillator divider value and a second oscillator divider value based on a jammer frequency;
a first frequency divider configured to output a first local oscillator signal by dividing a frequency of an oscillator signal by the first oscillator divider value;
a second frequency divider configured to output a second local oscillator signal by dividing the frequency of the oscillator signal by the second oscillator divider value;
a first mixer configured to downconvert the first RF signal portion on the first signal path by mixing the first RF signal portion with the first local oscillator signal to generate a first downconversion output signal on the first signal path;
a second mixer configured to downconvert the first downconversion output signal on the first path by mixing the first downconversion output signal with the second local oscillator signal to generate a second downconversion output signal on the first signal path; and
a filter configured to filter the second downconversion output signal on the first signal path to isolate an in-band signal from a jammer signal.

9. The RF receiver of claim 8, further comprising:
a second signal path to receive a second RF signal portion; and
a diplexer configured to receive an input RF signal from a single antenna and to provide a first output and a second output, the first output comprising the first signal path for the first RF signal portion and the second output comprising the second signal path for the second RF signal portion.

10. The RF receiver of claim 9, further comprising:
a single mixer configured to downconvert the second RF signal portion on the second signal path by mixing the first RF signal portion with a single local oscillator signal.

11. The RF receiver of claim 10, further comprising:
a divider configured to divide a frequency of a main oscillator signal by a fixed oscillator divider value.

12. The RF receiver of claim 9, further comprising:
a low noise amplifier disposed after the single antenna and the diplexer and before the first mixer; and
an other low noise amplifier disposed after the diplexer and before the single mixer.

13. The RF receiver of claim 8, further comprising:
a second signal path to receive a second RF signal portion;
a dual-band bandpass filter disposed between the single antenna and a wideband low noise amplifier, the wideband low noise amplifier comprising an output connected to the first signal path and the second signal path.

14. The RF receiver of claim 8, wherein the controller, the oscillator signal, the first frequency divider, and the second frequency divider are together configured such that the frequency of the first local oscillator frequency and the second local oscillator frequency are together appropriate for downconverting an L5 or an L2 band to an intermediate frequency (IF) that is one of zero intermediate frequency (ZIF), very low IF (VLIF), low IF (LIF), or an IF less than 50 MHz.

15. The RF receiver of claim 8, wherein the RF receiver is disposed within a mobile device.

16. An apparatus for processing a radio frequency (RF) signal received at one or more antennae, the apparatus comprising:
a first signal path;
means for identifying a jammer frequency;
means for selecting a first oscillator divider value and a second oscillator divider value based on the identified jammer frequency;
means for dividing the frequency of an oscillator signal using the first oscillator divider value to generate a first local oscillator signal;
means for dividing the frequency of the oscillator signal using the second oscillator divider value to generate a second local oscillator signal;
means for performing a first downconversion of the first RF signal portion on the first signal path by mixing the first RF signal portion with the first local oscillator signal to generate a first downconversion output signal on the first signal path;
means for performing a second downconversion of the first downconversion output signal on the first signal path by mixing the first downconversion output signal with the second local oscillator signal to generate a second downconversion output signal on the first signal path; and
means for filtering the second downconversion output signal to isolate an in-band signal from a jammer signal.

17. The apparatus of claim 16, further comprising:
a second signal path; and
means for performing a single downconversion of the second RF signal portion on the second signal path by mixing the first RF signal portion with a single local oscillator signal.

18. The apparatus of claim 17, wherein the single local oscillator signal is generated by dividing a frequency of a main oscillator signal using a fixed divider value.

19. The apparatus of claim 16, further comprising means for amplifying the RF signal received at the one or more antennae using a wideband low noise amplifier.

20. The apparatus of claim 19, further comprising means for filtering the RF signal received at the one or more antennae using a dual-band bandpass filter before amplifying the RF signal.

21. The apparatus of claim 16, wherein the means for receiving the RF signal at the one or more antennae comprises means for receiving a navigation signal from a same navigation satellite transmitting signals in a first band and in a second band different from the first band.

22. The apparatus of claim 21 wherein the first band is an L2 band or an L5 band and the second band is an L1 band.

* * * * *